(12) United States Patent
Enriquez

(10) Patent No.: US 6,492,930 B2
(45) Date of Patent: Dec. 10, 2002

(54) REDUCED PROPAGATION DELAY CURRENT MODE CASCADED ANALOG-TO-DIGITAL CONVERTER AND THRESHOLD BIT CELL THEREFOR

(75) Inventor: Leonel Ernesto Enriquez, Melbourne Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/901,327

(22) Filed: Jul. 9, 2001

(65) Prior Publication Data

US 2002/0036583 A1 Mar. 28, 2002

Related U.S. Application Data

(63) Continuation-in-part of application No. 09/639,408, filed on Aug. 14, 2000, now Pat. No. 6,411,163.

(51) Int. Cl.[7] .................................................. H03M 1/12
(52) U.S. Cl. ....................................... 341/155; 341/161
(58) Field of Search ............................... 341/155, 161, 341/162; 330/257

(56) References Cited

U.S. PATENT DOCUMENTS

| | | | | |
|---|---|---|---|---|
| 4,091,333 A | | 5/1978 | Thrap .......................... 330/100 |
| 4,558,287 A | | 12/1985 | Tanaka ........................ 330/257 |
| 5,210,506 A | | 5/1993 | Koch et al. .................. 330/255 |
| 5,357,210 A | | 10/1994 | Miljanic et al. ............ 330/15.1 |
| 5,671,272 A | | 9/1997 | Cotreau ....................... 379/382 |
| 5,812,440 A | * | 9/1998 | Suminaga et al. ............. 365/51 |
| 5,929,623 A | | 7/1999 | Hoshino ....................... 330/257 |
| 6,154,094 A | | 11/2000 | Seven ........................... 330/257 |
| 6,222,478 B1 | * | 4/2001 | Bright .......................... 341/162 |
| 6,313,780 B1 | * | 11/2001 | Hughes et al. ............... 341/156 |
| 6,356,225 B1 | * | 3/2002 | Johnstone et al. ........... 341/155 |

FOREIGN PATENT DOCUMENTS

| JP | 407007337 A | 1/1995 | ............. H03F/3/34 |
|---|---|---|---|
| JP | 408018398 A | 1/1996 | ............. H03F/1/34 |

OTHER PUBLICATIONS

"A CMOS Transistor–Only 8–b 4.5–Ms/s Pipelined Analog––to–Digital Converter Using Fully–Differential Current––Mode Circuit Techniques", by Chung–Yu Wu, Chih–Cheng Chen, and Jyh–Jer Cho; *IEEE Journal Of Solid–State Circuits*, vol. 30, No. 5, May, 1995, pp. 522–532.

* cited by examiner

*Primary Examiner*—Peguy Jeanpierre
(74) *Attorney, Agent, or Firm*—Christopher F. Regan, Esq.; Allen, Dyer, Doppelt, Milbrath & Gilchrist, PA

(57) ABSTRACT

A non-sampling cascaded current mode analog-to-digital converter is formed of cascaded threshold detector bit cells driven by a transconductance amplifier for substantially instantaneously propagated current mode operation. A front end stage receives an input voltage representative of the quantity to be digitized, and outputs a pair of currents to N−1 cascaded, identically configured threshold comparator-based bit cells, N being the number of bits of resolution of the converter. A bit cell resolves a digital bit and couples a pair of output currents to the next bit cell. The N−1th bit cell in the cascaded architecture is configured to provide both the next to least significant bit and the least significant bit.

20 Claims, 4 Drawing Sheets

REDUCED PROPAGATION DELAY CURRENT MODE CASCADED ANALOG-TO-DIGITAL CONVERTER AND THRESHOLD BIT CELL THEREFOR

CROSS REFERENCE TO RELATED APPLICATIONS

The present application is a continuation-in-part of my U.S. patent application, Ser. No. 09/639,408, entitled: "Transconductance Amplifier Circuit," filed Aug. 14, 2000 (hereinafter referred to as the '408 application), now U.S. Pat. No. 6,411,163, assigned to the assignee of the present application, and the disclosure of which is incorporated herein.

FIELD OF THE INVENTION

The present invention relates in general to communication systems and components, and is particularly directed to a new and improved current mode analog-to-digital (A/D) converter, containing a cascaded arrangement of threshold detector bit cells that are driven by a transconductance amplifier architecture of the type described in my above-referenced '408 application, that is capable of very fast conversion times due to its substantially instantaneously propagated current mode operation, very limited voltage deflections and lack of feedback requirements.

BACKGROUND OF THE INVENTION

Due to the extremely rapid advancement of digital signal processing technologies, many if not most signal processing systems and networks are currently (and can be expected to continue to be) designed to operate in the digital domain. As the raw signals input to these systems and networks are analog, a critical component at the front end of the overall signal flow path is the analog-to-digital converter, which quantizes the analog signal into a form suitable for digital processing.

A particularly attractive type of A/D converter that has been proposed for low voltage overhead, high speed signal processing applications, such as but not limited to telecommunication networks, is a pipelined architecture that uses differential current mode techniques. Among the advantages of this type of converter are inherent low voltage swing and the elimination of the need for linear capacitors. (For a non-limiting example of documentation that describes the general architecture and benefits of a pipelined, differential current mode-based A/D converter, attention may be directed to an article by Chung-Yu Wu et al, entitled: "A CMOS Transistor-Only 8-b 4.5-Ms/s Pipelined Analog-to-Digital Converter Using Fully-Differential Current-Mode Circuit Techniques," IEEE Journal of Solid-Stage Circuits, Vol. 30, No. 5, May, 1995, pp. 522–532.)

SUMMARY OF THE INVENTION

In accordance with the present invention advantage is taken of the performance and signal processing functionality of the transconductance amplifier circuit disclosed in the above-referenced '408 application, to realize a substantially improved A/D converter architecture implemented as a cascaded arrangement of current mode-based threshold detector bit cells. The A/D converter of the invention is capable of very fast conversion times due to its substantially instantaneously propagated current mode operation, very limited voltage deflections and lack of feedback requirements, making it attractive for high speed signal processing applications, such as, but not limited to, telecommunication modem chips.

Although it has a multi-bit cell or multistage cascaded configuration, the current mode A/D converter architecture of the present invention is not 'pipelined' in the customary sense; in the cascaded architecture of the invention, there is no sampling delay associated with each successive bit-stage of the converter. Instead, when an input voltage Vin representative of an analog quantity to be digitized is applied to an upstream-most or front end transconductance-based stage of the converter's cascaded sequence of bit cells, the only delay encountered is that associated with the electronic propagation delays through the electronic components in the 'rippling' path along the downstream threshold-based bit cells. There is no sample and store operation in any cell, so that there is no associated storage delay as is customarily encountered in a conventional 'pipelined' architecture.

The A/D converter architecture of the invention has a front end stage which receives an input voltage Vin representative of the quantity Q to be digitized, and outputs a pair of output currents to a first or most significant bit (MSB)-associated one of N−1 cascaded, identically configured A/D (threshold comparator-based) bit cells, where N corresponds to the digital code (number of bits) resolution of the A/D converter. In accordance with a non-limiting but preferred implementation, the front end stage contains a transconductance amplifier circuit of the type described in the foregoing '408 application. It also includes circuitry that generates a set of accurate and stable reference voltage and currents used by the circuitry of each downstream A/D cell to resolve its respective bit.

A respective current threshold-based ith A/D cell outputs a single ith digital bit (either a '1' or a '0') of the overall N-bit digital code output of the converter and also couples a pair of output currents to the next (i+1)th A/D cell. The last or N−1th A/D cell of the cascaded bit cells is configured to provide both the next to least significant bit and the least significant bit (LSB) of the resolved N bit code.

For this purpose, a respective A/D 'bit' cell has first and second current input ports, respectively coupled to the first and second current output ports of the immediately preceding bit cell. The first current input port is coupled to a thresholding reference node, which is coupled to a first leg or side of a Darlington-configured differential transistor pair-based, bit-resolving circuit, and to a first leg or side of a Darlington-configured differential transistor pair-based, current-steering circuit.

The bit-resolving differential pair is operative to selectively establish the state of the cell's output bit, based on whether the value of the first input current is at least equal to the value of the copy of a reference current supplied to each cell from the front end stage. The current-steering differential pair selectively controls the mirroring of the value of the second input current, either as is, to each of the first and second current output ports, or steers the difference between the first input current and the reference current to current mirror circuitry for production of mirrored currents proportional to this difference for application to the next downstream cell.

If the value of the input currents is equal to or greater than the reference current, the current-steering circuit diverts the second input current to a voltage supply rail, so that the second input current cannot be coupled to the current mirror. In addition, the bit-resolving circuit steers the bias current in a manner that causes a high ('1') logic level to be applied to the bit output terminal of that cell. On the other hand, if the value of the input current is less than the reference current, the current-steering circuit applies the second input current to the current mirror, while the bit-resolving circuit steers the bias current in a manner that causes a low ('0') logic level to be applied to the bit output terminal of that cell.

DETAILED DESCRIPTION

Figure 1:
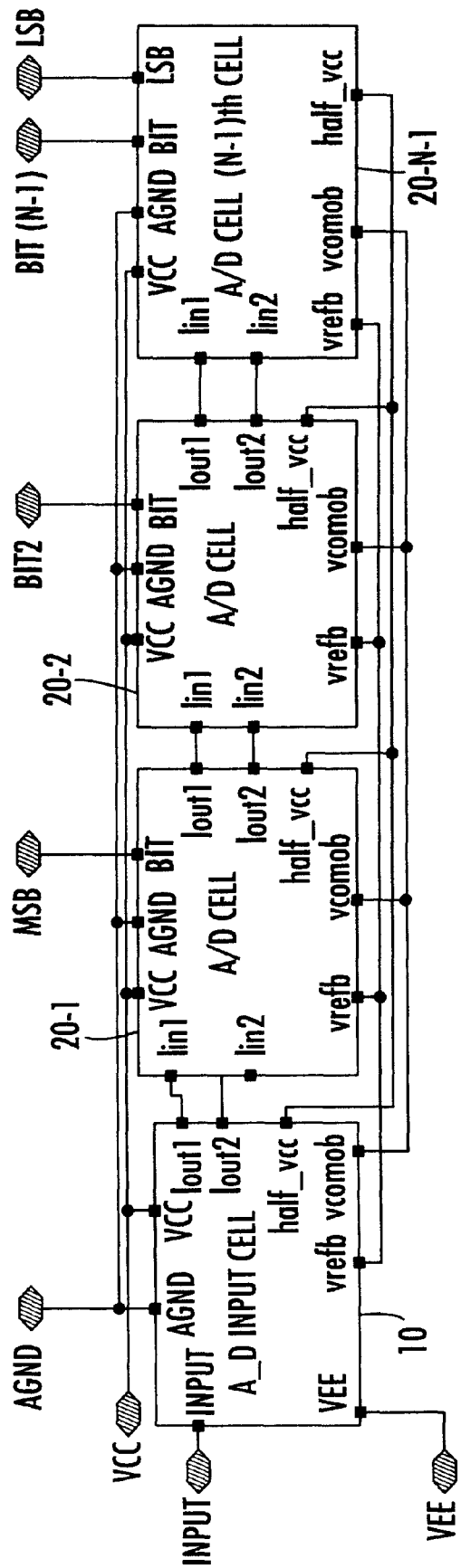
FIG. 1 is a block diagram of the current mode cascaded A/D converter architecture of the present invention.

Before describing a non-limiting example of an implementation of the current mode threshold detector-based, cascaded analog-to-digital (A/D) converter architecture of the present invention, it is initially useful to review the signal processing functionality performed by an A/D converter. Letting a raw analog quantity Q to be digitally resolved be bounded by respective upper and low values of 0 and $Q_F$, then any value of Q that falls within this range can be defined as:

$$Q = \left[Q_F \sum_{i=1}^{N} a_i (1/2)^i\right] + E_Q(N), \quad (1)$$

where $a_i$ is a respective binary number (0 or 1),

N is the number of bits used to resolve the quantity Q, and $E_Q$ is the quantization error associated with the number of bits chosen.

As a non-limiting illustration, consider the following reduced complexity set of parameters applied to the equation (1): $Q_F=16$, N=4 and an input Q=11.3. Then, from equation (1), $$11.3 = 16[1 \times (1/2)^1 + 0 \times (1/2)^2 + 1 \times (1/2)^3 + 1 \times (1/2)^4] + E_{11.3}(4)$$
$$= 16[1 \times (1/2) + 0 \times (1/4) + 1 \times (1/8) + 1 \times (1/16)] + E_{11.3}(4)$$
$$= 16(8+0+2+1)/16 + E_{11.3}(4)$$
$$= 16 \times (11/16) + E_{11.3}(4)$$
$$= 11 + E_{11.3}(4)$$

so that the quantization error is $E_{11.3}(4) = 0.3$

From the foregoing it is readily apparent that the smallest quantity that can be resolved using this methodology is:

$$LSB=16[0 \times (\tfrac{1}{2})+0 \times (\tfrac{1}{4})+0 \times (\tfrac{1}{8})+1 \times (\tfrac{1}{16})]=1$$

Equation (1) suggests the following scheme for determining the coefficients $a_i$ for an arbitrary quantity Q, for a given $Q_F$ and N.

$$Q-E_Q(N)=Q_Q=Q_F[a_{1\times}(\tfrac{1}{2})+a_{2\times}(\tfrac{1}{4})+\ldots+a_N \times (\tfrac{1}{2})^N] \quad (2)$$

where $Q_Q$ is the quantized value of Q. Then $$Q_Q=a_1 Q_F/2+a_2 Q_F/4+\ldots+a_N Q_F/2^N \quad (3)$$

From equation (3), if $Q_F/2<Q_Q$, then $a_1=1$ and $$Q_1(1)=Q_Q-Q_F/2=a_2 Q_F/4+\ldots+a_N Q_F/2^N \quad (4)$$

Conversely, if $Q_F/2>Q_Q$, then $a_1=0$ and $$Q_1(0)=Q_Q=a_2 Q_F/4+\ldots+a_N Q_F/2^N \quad (5)$$

where the terms $Q_1(1)$ and $Q_1(0)$ are defined such that $$Q_1(k)=Q_Q=a_2 Q_F/4+\ldots+a_N Q_F/2^N \quad (6)$$

whether k=1 or k=0, with the subtraction expression of equation (4) being used when $a_1=1$.

From equation (6) if follows that $$2Q_1(k)=Q_Q=a_2 Q_F/2+\ldots+a_N Q_F/2^{N-1} \quad (7)$$

Accordingly, if $a_2=1$, then $$Q_2(1)=2Q_1(k)-Q_F/2=a_3 Q_F/2+\ldots+a_N Q_F/2^{N-1} \quad (8)$$

In a complementary fashion, if $a_2=0$ $$Q_2(0)=2Q_1(k)=a_3 Q_F/2^2+\ldots+a_N Q_F/2^{N-1} \quad (9)$$

and $$Q_2(k)==a_3 Q_F/2^2+\ldots+a_N Q_F/2^{N-1} \quad (10)$$

irrespective of whether k=1, or k=0, with the subtraction indicated by equation (8) when $a_2=1$.

This process of performing a subtraction operation when the ith bit is a '1' and doubling the remaining quantity in either case can be implemented N and N−1 times respectively, such that the ith iteration may be defined by:

$$Q_i(k)=a_{i+1} Q_F/4+\ldots+a_N Q_F/(2^{N-i+1}) \quad (11)$$

It should be observed that where a subtraction operation is required, due to the fact that the corresponding bit equals 1, the quantity to be subtracted is always $Q_F/2$.

As described briefly above, and as shown in the block diagram of FIG. 1, the present invention implements the foregoing cascaded process by means of a current mode A/D converter architecture, having a transconductance amplifier-based, current-generating front end stage or A_D Input Cell 10 (shown in detail in FIG. 2 to be described) to which a plurality of threshold detector-based bit cells 20 (shown in detail in FIGS. 3 and 4, to be described) are coupled in cascade. The front end stage 10 has an input port INPUT, that is coupled to receive an input voltage Vin representative of the quantity Q to be digitized, and a pair of output ports Iout1 and Iout2. These output ports apply a pair of output currents to respective input ports Iin1 and Iin2 of a first or most significant bit (MSB)—associated one of N−1 cascaded, identically configured bit or A/D cells 20-1, 20-2, . . . , 20-N−1, where N corresponds to the digital code (number of bits) resolution of the A/D converter.

The front end stage 10 includes additional circuitry that generates a bias voltage (half_Vcc (Vcc/2)) and a pair of reference currents (Iref and Ibias) to be described, which are employed by the circuitry of each downstream A/D cell 20$i$ and the last A/D cell 20-N−1 to perform thresholding functions, including resolving respective output bits. In particular, the thresholding function performed by a respective ith A/D cell 20-$i$ employs a first differential pair-based, bit-resolving circuit, referenced to the two reference currents Iref and Ibias, to resolve an individual ith bit (either a '1' or a '0') of the overall N-bit digital code output of the converter. It also employs a second differential pair-based current-steering circuit, referenced to the reference current Iref, to define the magnitude of a pair of output currents Iout1-$i$ and Iout2-$i$ that it couples to the next (i+1)th A/D cell 20-$i$+1. The last or N–1th A/D cell 20-N–1, which terminates the cascaded plurality of cells, employs the same thresholding circuitry as the other (upstream) A/D cells to provide both the next to least significant bit and the least significant bit (LSB) of the resolved N bit code.

Figure 2:
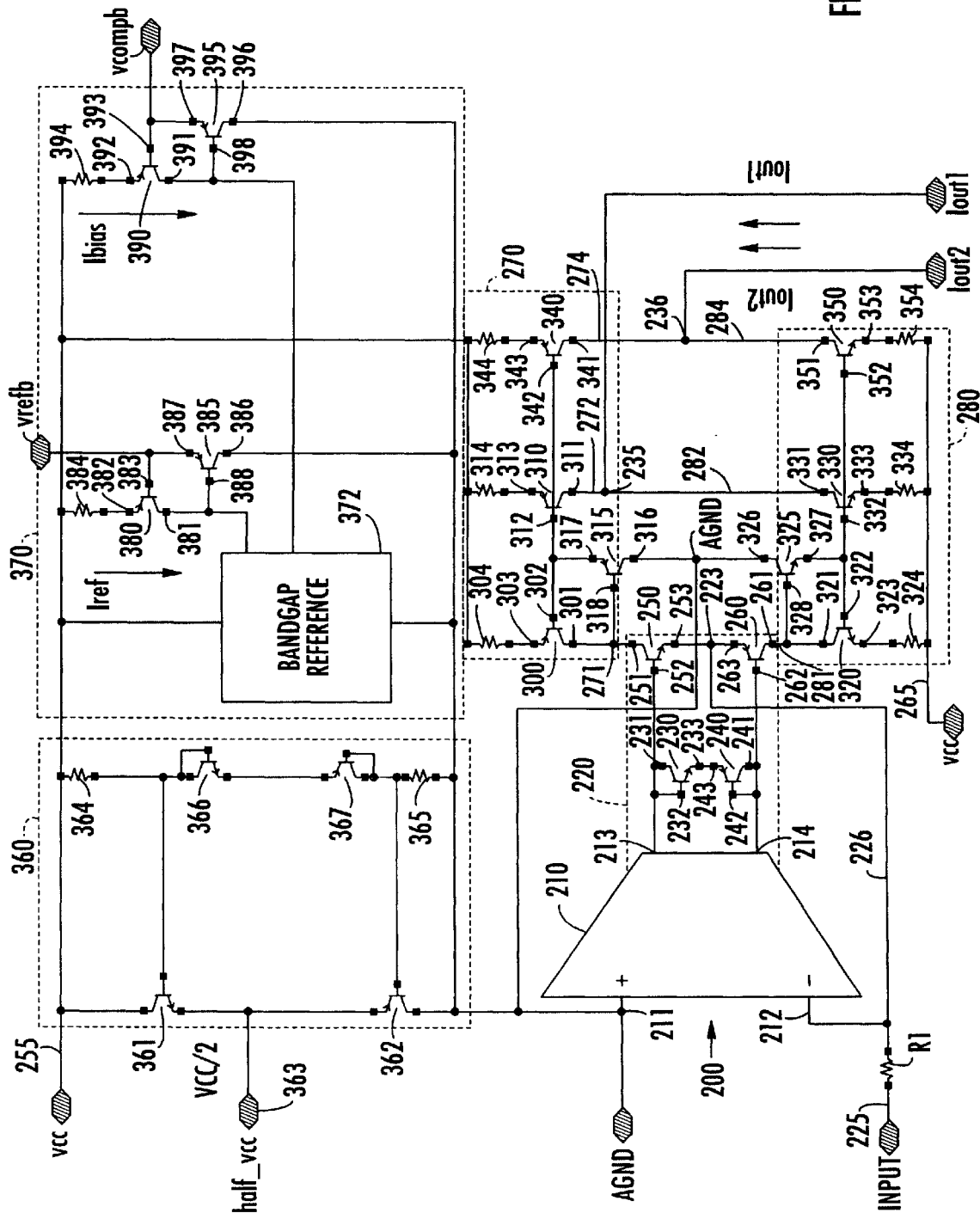
FIG. 2 schematically shows a transconductance amplifier circuit disclosed in the above-referenced '408 application and employed in the front end stage of the current mode cascaded A/D converter architecture of FIG. 1.
Figure 3:
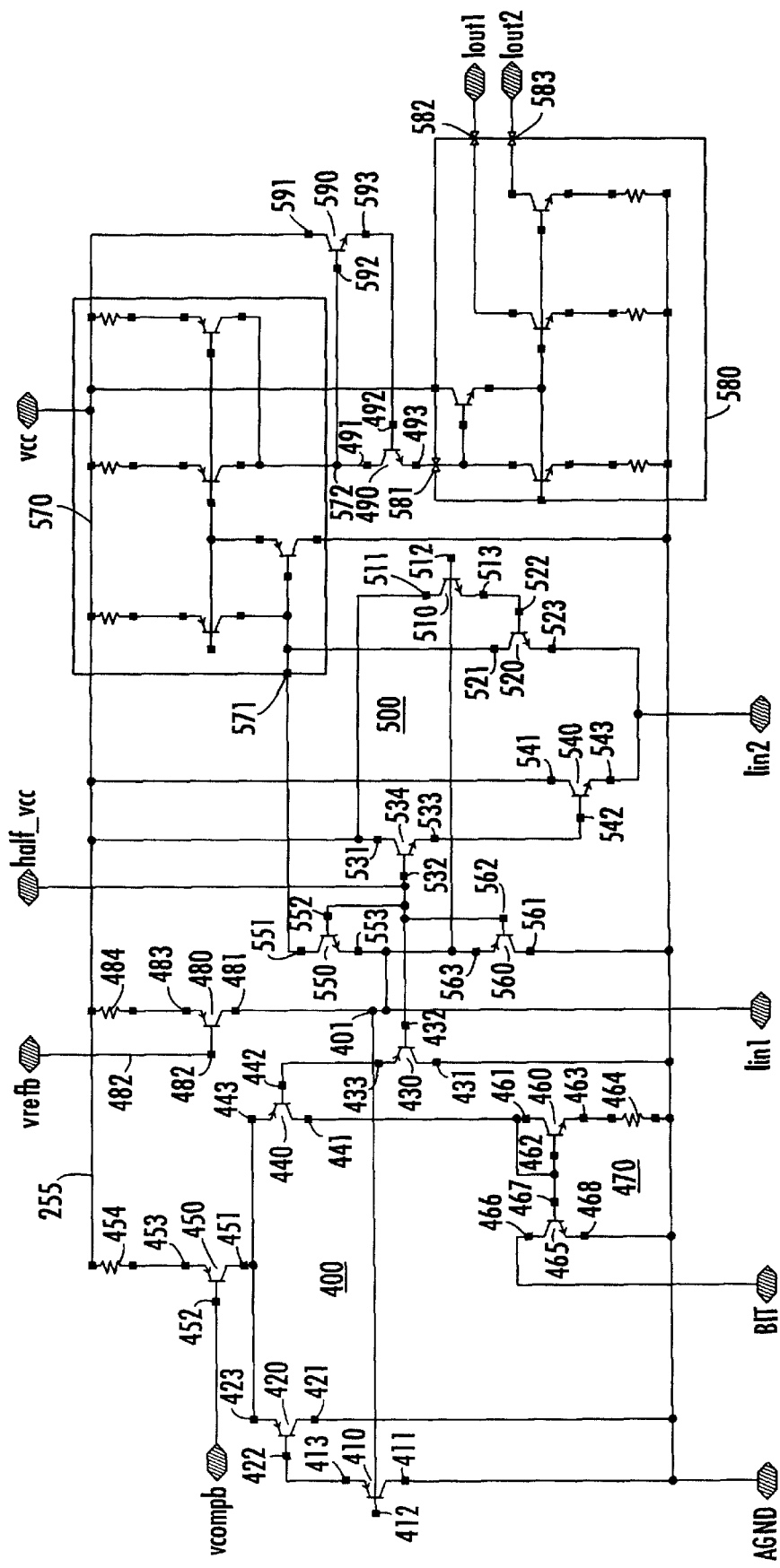
FIG. 3 schematically shows the configuration of a respective A/D cell of the cascaded A/D architecture of FIG. 1.
Figure 4:
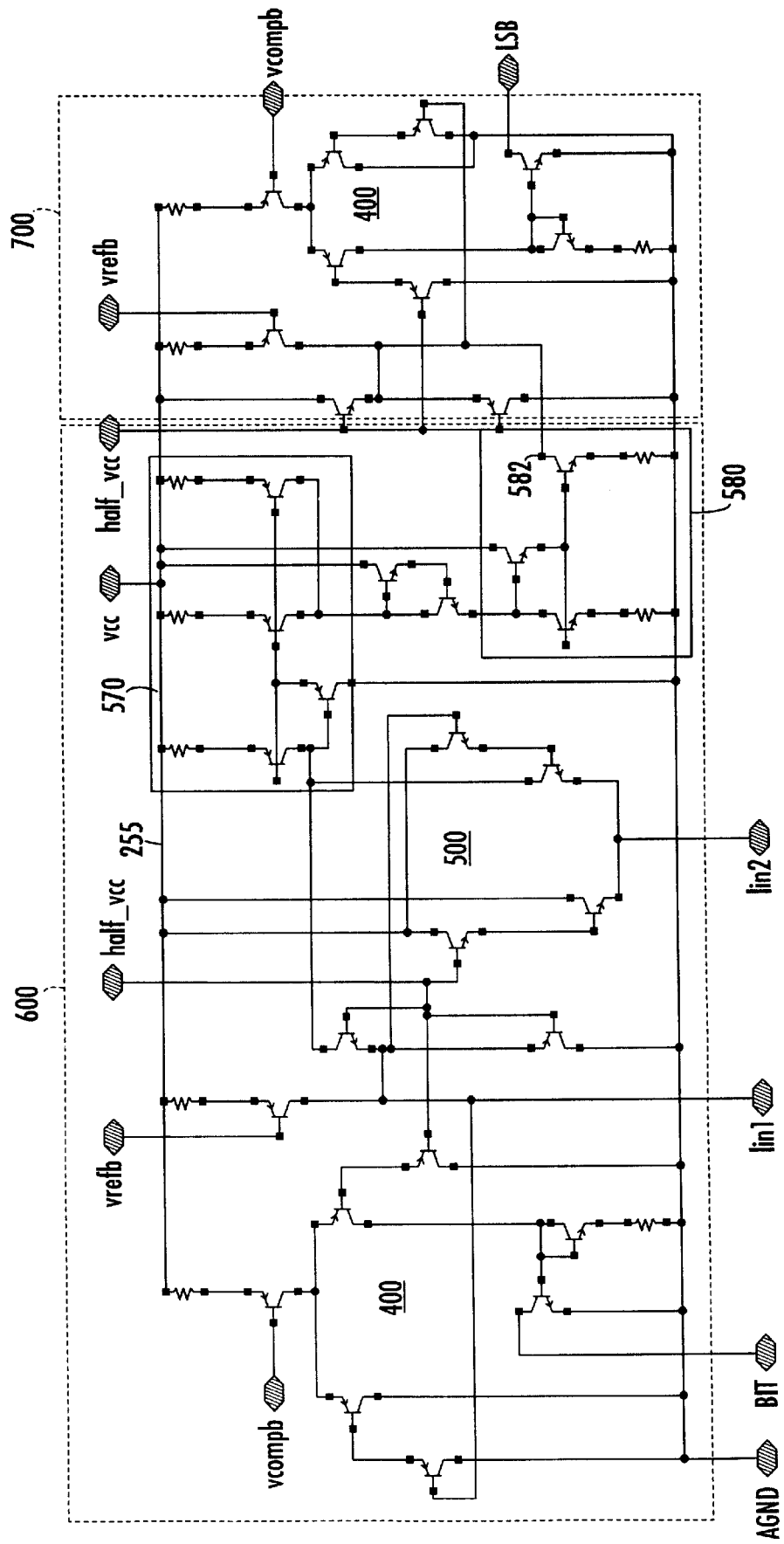
FIG. 4 schematically shows the configuration of the last or (N−1)th A/D cell of the cascaded A/D architecture of FIG. 1.

Referring to FIG. 2, a schematic diagram of a non-limiting bipolar transistor-based implementation of the front end stage 10 of the current mode, cascaded A/D converter architecture of FIG. 1 is shown as comprising a transconductance amplifier block 200 to which the input port INPUT is coupled. As pointed out above, in accordance with a non-limiting but preferred implementation, the transconductance amplifier block is preferably of the type described in the foregoing '408 application, and will be described as such. Moreover, although the architecture of FIG. 2, as well as those of FIGS. 3 and 4 depict the use of bipolar devices, it is to be understood that the invention is not limited thereto, but also may be implemented using alternative equivalent components, such as field effect transistors (FETs), for example.

As described in the '408 application and as shown in FIG. 2, the transconductance amplifier block 200 includes an operational amplifier configured as a unity gain buffer. The operational amplifier has a dual polarity input and gain stage 210, and a low output impedance, single ended output stage 220. The input and gain stage 210, which may have a conventional high impedance, moderate voltage gain circuit configuration, has a first, non-inverting polarity input 211, that is adapted to be coupled to a DC reference voltage v0, shown as ground (AGND), and a second, inverting polarity input 212, which is adapted to track the input voltage v0. The input voltage v0 can be selected in compliance with the overhead voltages and power dissipation required by the specific application in which the transconductance amplifier circuit is employed.

The output stage 220 includes a differentially coupled transistor circuit pair, having a first, diode-connected NPN transistor 230, whose collector 231 and base 232 are connected in common to a first polarity output port 213 of the amplifier's input stage 210. The emitter 233 of NPN transistor 230 is coupled in common to the emitter 243 of a second, diode-connected PNP transistor 240. In a complementary fashion, PNP transistor 240 has its collector 241 and base 242 connected in common to a second polarity output port 214 of the amplifier input stage 210. The base 232 of the NPN transistor 230 is coupled in common with the base 252 of an NPN transistor 250, the emitter 253 of which is coupled in common to the emitter 263 of a PNP transistor 260 and to an input/output node 223 of the output stage 220.

The PNP transistor 260 has its base 262 coupled in common with the base 242 of the PNP transistor 240. The output stage has an input/output node 223 coupled in a follower configuration over a negative feedback path 226 to the inverting input 212 of the input stage 210. Unlike a conventional amplifier circuit, the input/output node 223, rather than being employed to supply an output current to a downstream load, is coupled to receive an input current supplied through an input-coupling resistor R1 to (voltage-feeding) INPUT port 225. With a voltage Vin representative of the quantity Q to be quantized applied to the input port 225, an input current Iin will flow through the input resistor R1.

The series-connected, collector-emitter current paths through the output transistors 250 and 260 of the amplifier's output stage 220, rather than being biased via a direct coupling to respective (Vcc and Vee) voltage supply rails 255 and 265, are coupled in circuit with first current supply paths 271 and 281 of first (PNP) and second (NPN) current mirror circuits 270 and 280, respectively. These current mirror circuits serve to isolate the biasing of the amplifier's output stage 220 from its power supply terminals, so that the output current produced at a single ended output node/port 235 and 236 can be accurately controlled independent of the values of the power supply voltages.

The PNP current mirror circuit 270 includes a first PNP transistor 300 having its collector 301 coupled to the first current supply path 271 and its emitter 303 coupled via resistor 304 to the (Vcc) voltage supply rail 255. Its base 302 is coupled in common with the base 312 of a current mirror PNP transistor 310, and the emitter 317 of a PNP transistor 315, the base 318 of which is coupled to the current supply path 271 and the collector 316 of which is coupled to AGND. The emitter 313 of current mirror transistor 310 is coupled through resistor 314 to the (Vcc) voltage supply rail 255, while its collector 311 is coupled over mirrored current supply path 272 to output node/port 235. The current mirror transistor 310 supplies a mirrored output current to the current supply path 272 as a prescribed factor K of the current received by transistor 300 over the current supply path 271, in accordance with the ratio (1:K) of the geometries of the transistors 300/310 and resistors 314/304.

In a complementary manner, the NPN current mirror circuit 280 includes a first NPN transistor 320 having its collector 321 coupled to the second current supply path 281 and its emitter 323 coupled via resistor 324 to the (Vee) voltage supply rail 265. Its base 322 is coupled in common with the base 332 of an NPN current mirror transistor 330, and to the emitter 327 of an NPN transistor 325, the base 328 of which is coupled to the current supply path 281 and the collector 326 of which is coupled to AGND. The emitter 333 of current mirror transistor 330 is coupled through resistor 334 to the (Vee) voltage supply rail 265, while its collector 331 is coupled over the mirrored current supply path 282 to the output node/port 235. The NPN current mirror transistor 330 also supplies a mirrored output current to the current supply path 282 as a prescribed factor K of the current received by transistor 320 over the current supply path 281, in accordance with the ratio (1:K) of the geometries of the transistors 320/330 and resistors 334/324.

An examination of current node equations that define the transfer function of the transconductance amplifier circuit of FIG. 2 reveals that it has a very wide dynamic range and is capable of accommodating single or multiple, differential polarity voltages applied at its one or more voltage feed ports. This wide dynamic range is obtained at a very low quiescent power dissipation.

More particularly, the single ended output current $i_{223}$ delivered to input/output node 223 may be defined in equation (12) as:

$$I_{223}=(v_{225}-v_{211})/R1 \tag{12}$$

The currents $i_{271}$ and $i_{281}$ supplied to current mirrors 270 and 280 may be related to the current $i_{223}$ at the input/output node 223 by equation (13) as:

$$i_{223}+i_{271}=i_{281} ==> i_{223}=i_{281}-i_{271} \tag{13}$$

The currents $i_{272}$ and $i_{282}$ supplied by current mirrors 270 and 280 may be related to current $i_{235}$ at node 235 by equation (14):

$$i_{272}+i_{235}=i_{282} \quad (14)$$

and equation (15) as:

$$Ki_{271}+i_{235}=Ki_{281} => Iout1-i_{235}=K(i_{281}-i_{271})=Ki_{223} \quad (15)$$

Substituting equation (12) into equation (15) yields equation (16) as:

$$Iout1=K(v_{225}-v_{211})/Rin \quad (16)$$

Equations (14) and (16) imply that transistor limitations due to beta and early voltage are compensated or minimized (in a manner not specifically shown in FIG. 2). It may also be noted that if transistors 230/250 and 240/260 of output stage 220 are matched pairs and the time average value of the input voltage is equal to zero, then the time average values of currents $i_{271}$ and $i_{281}$ are equal to the DC bias current $I_{DC}$ flowing in the emitter path of the output stage transistors 230–240. As a consequence, if the value of the bias current $I_{DC}$ is relatively low and the current mirror ratio K is equal to or less than 1, the quiescent power consumed by the transconductance amplifier circuit can be reduced to a very small value.

In addition to having their common node 235 coupled to the first current output terminal Iout1, each of the current mirror circuits 270 and 280 of the transconductance block employed in the front end stage of FIG. 2 includes an additional current mirror output transistor, from which a respective copy of the mirrored current of the current supply path 272, 282 is supplied. In FIG. 2, these additional mirrored copies of the currents of current mirror output paths 272 and 282 are supplied over respective auxiliary current mirror supply paths 274 and 284. The current mirror supply paths 274 and 284 are connected in common to a node 236, which is coupled to the second current output terminal Iout2, from which the second output current Iout2 is supplied.

The PNP current mirror circuit 270 includes an additional PNP current mirror transistor 340 having its collector 341 coupled to the first additional current supply path 274 and its emitter 343 coupled via a resistor 344 to (Vcc) voltage supply rail 255. Its base 342 is coupled in common with the base 312 of current mirror PNP transistor 310. Current mirror transistor 340 supplies an additional mirrored output current to the current supply path 274 as a prescribed factor M (e.g., M=K) of the current received by the transistor 300 over the current supply path 271, in accordance with the ratio (1:M) of the geometries of the transistors 300/340 and resistors 344/304.

Likewise, the NPN current mirror circuit 280 includes an additional NPN current mirror transistor 350 having its collector 351 coupled to the first additional current supply path 284 and its emitter 353 coupled via a resistor 354 to the Vee voltage supply rail 265. Its base 352 is coupled in common with the base 322 of current mirror NPN transistor 320. The additional NPN current mirror transistor 350 supplies a mirrored output current to the current supply path 284 as a prescribed factor M (e.g., M=K) of the current received by the transistor 320 over the current supply path 281, in accordance with the ratio (1:M) of the geometries of the transistors 320/350 and resistors 354/324.

As pointed out briefly above, in addition to providing first and second equal output currents Iout1 and Iout2 representative of the quantity Q associated with the voltage applied to the input terminal INPUT, front end stage 10 is configured to generate a set of accurate and stable reference parameters used by the threshold circuitry of each downstream A/D cell to resolve its respective bit, and to establish the magnitude of the current to be coupled to the next successive bit cell. One of these references is a bias voltage (Vcc/2) that is derived by a voltage divider circuit 360.

As shown in FIG. 2, the voltage divider circuit 360 contains respective complementary NPN and PNP transistors 361 and 362 having their collector-emitter paths coupled in circuit between the Vcc supply rail 255 and AGND. A half__Vcc output terminal 363 providing a voltage (Vcc/2) equal to half the Vcc rail voltage is coupled to the commonly connected emitters of transistors 361 and 362. The base of NPN transistor 361 is biased via a resistor 364 coupled to the Vcc rail 255, while the base of PNP transistor 362 is biased via a resistor 365 coupled to AGND. A pair of diode-configured NPN and PNP transistors 366 and 367, respectively, are connected back-to-back between bias resistors 364 and 365.

The front end stage also provides an additional pair of reference currents Iref (provided by a port vrefb) and Ibias (provided at port vcompb) that are generated by a dual port bandgap-based reference circuit 370. In particular, the reference circuit 370 contains a precision voltage element, such as a bandgap voltage reference device 372, that is coupled between the VCC voltage supply rail 255 and the collectors 381 and 391 of respective transistors 380 and 390.

Transistor 380 has its emitter 382 coupled in circuit with a resistor 384, which is terminated at the Vcc rail 255. An additional base current compensator PNP transistor 385, whose collector 386 is tied to AGND, has its emitter 387 coupled to the base 383 of transistor 380 and its base 388 coupled to the collector 381 of transistor 380. The emitter 387 of transistor 385 is coupled to a first output reference current terminal vrefb. The output reference voltage terminal vrefb is used to generate copies of the current Iref at each of the cells 20. The current Iref is proportional to a prescribed 'bit slice' reference voltage Vref/2, representative of the quantity $Q_F/2$ of the above-described equations. In particular, as will be detailed below, the thresholding function performed by a respective A/D cell employs a first differential transistor pair-based, bit-resolving circuit, that is referenced to the two reference currents Iref and Ibias, to resolve an individual ith bit, and a second differential transistor pair-configured, current-steering circuit, that is referenced to the reference current Iref, to define the magnitude of a pair of equal output currents Iout1-i and Iout2-i that it supplies to the next A/D cell.

Transistor 390 has its emitter 392 coupled in circuit with a resistor 394, which is terminated at the Vcc rail. An additional base current compensator PNP transistor 395, whose collector 396 is tied to AGND, has its emitter 397 coupled to the base 393 of transistor 390 and its base 398 coupled to the collector 391 of transistor 390. The emitter 397 of transistor 395 is coupled to a second output reference voltage terminal vcompb. The output reference voltage terminal vcompb is used to generate copies of the current Ibias at each of the cells 20. The current Ibias is used by the bit value-resolving differential transistor pair, to set the value of the cell's output bit.

FIG. 3 schematically shows the configuration of a respective threshold-based A/D cell 20-i of the cascaded architecture of FIG. 1. As described briefly above, and as will be detailed hereinafter, a respective bit cell is operative to output a single ith digital bit (either a '1' or a '0') of the overall N-bit digital code output of the converter and also couple to the next (i+1)th A/D cell a pair of equal output currents Iout1-i and Iout2-i whose values are associated with the binary value of the resolved digital bit for that cell.

For this purpose, a respective A/D cell has a first current input port Iin1 coupled to the first current output port Iout1 of the immediately preceding cell, and a second current input port Iin2 coupled to the second current output port Iout2 of cell the immediately preceding cell. The first current input port Iin1 of the respective cell is coupled to a (thresholding reference) node 401, which is connected to the base 412 of a first input PNP transistor 410 in a first leg of a first Darlington-configured differential transistor pair-based, bit-resolving circuit 400, and to the base 512 of a first input NPN transistor 510 of a first leg of a second Darlington-configured differential transistor pair-based, current-steering circuit 500.

As will be described, the bit-resolving differential transistor pair 400 is operative to selectively establish the state of the cell's output bit (BIT), based on whether the value of the first input current Iin1 is at least equal to the value of the copy of the reference current Iref (proportional to Vref/2) generated by front end stage 10 and mirrored with terminal vrefb. The current-steering differential transistor pair 500 is operative to selectively control the mirroring of the value of the second input current Iin2, either as is, to each of the first and second current output ports Iout1 and Iout2, or otherwise prevent the value of the second input current Iin2 from being mirrored at these outputs.

In this latter case, the differential current-steering transistor pair 500 allows the difference between the first input current Iin1 and the reference current Iref to be mirrored at each of the first and second current output ports Iout1 and Iout2 for application to the next downstream cell.

For this purpose, the NPN input transistor 410 of the differential transistor pair 400 is coupled in Darlington configuration with a PNP transistor 420, the emitter 423 of which is coupled to the collector 451 of a PNP transistor 450, whose emitter 453 is coupled through resistor 454 to the Vcc voltage supply rail 255, and the base 452 of which is coupled to receive the bias voltage from the vcompb terminal of the front end stage 10. This results in the mirroring of current Ibias by transistor 450. Transistors 410 and 420 have their respective collectors 411 and 421 connected in common to AGND.

The second leg of the bit-resolving differential pair 400 includes a PNP input transistor 430, having its base 432 coupled to receive the voltage Vcc/2 provided by the bias terminal 363 of the front end stage 10. Transistor 430 has its collector 431 coupled to AGND, and its emitter 433 coupled to the base 442 of PNP output transistor 440, the emitter 443 of which is coupled to the collector 451 of PNP transistor 450. The collector 441 of the PNP output transistor 440 is coupled to commonly connected collector 461 and base 462 of a diode-configured NPN transistor 460 of a bit current output driver circuit 470. Transistor 460 has its emitter 463 coupled through a resistor 464 to AGND. The base 462 of transistor 460 is coupled to the base 467 of NPN current output transistor 465, the emitter 468 of which is coupled to AGND and the collector 466 of which is coupled to an output bit terminal BIT.

The NPN input transistor 510 of the first leg of the current-steering differential pair 500 has its emitter 513 coupled to the base 522 of an NPN output transistor 520, the emitter 523 of which is coupled in common with the emitter 543 of an NPN transistor 540 of the second leg of the current-steering differential transistor pair 500 to the second current input port Iin2. The collector 511 of NPN input transistor 510 and the collector 531 of NPN input transistor 530 of the second leg of the current-steering differential transistor pair 500 are coupled to the Vcc rail 255. The emitter 533 of transistor 530 in the second leg of the current-steering, differential transistor pair 500 is coupled to the base 542 of transistor 540, whose collector 541 is coupled to the Vcc rail 255.

The base 532 of the transistor 530 in the second leg of the current-steering, differential transistor pair 500 is coupled to receive the voltage Vcc/2 provided by the bias terminal 363 of front end stage 10. The output transistor 520 has its collector 521 coupled to a current input port 571 of a first (1:2) current mirror circuit 570, which is configured to provide a times-two multiplication of the input current supplied to input port 571 at its output port 572. This gain of two output current is coupled to an input port 581 of a second (1:1) current mirror circuit 580. The current mirror circuit 580 has first and second output ports 582 and 583 coupled to A/D cell output terminals Iout1-*i* and Iout2-*i*.

A pair of base current error compensation transistors 490 and 590 are coupled between the output port 572 of the first (1:2) current mirror 570 and the input port 581 of the second (1:1) current mirror 580. NPN transistor 490 has its collector 491 coupled to the output port 572 of the current mirror 570 and the base 592 of NPN transistor 590, the collector 591 of which is coupled to the Vcc rail 255. Transistor 490 has its base 492 coupled to the emitter 593 of transistor 590 and its emitter 493 coupled to input port 581 of the current mirror 580.

In addition to being connected to each of the differential transistor pairs 400 and 500, thresholding reference node 401, to which the first current input port Iin1 is applied, is coupled to the collector 481 of a current mirror transistor 480, the base 482 of which is coupled to the voltage terminal Vrefb to generate a copy of the reference current Iref (proportional to Vref/2). The emitter 483 of transistor 480 is coupled through a resistor 484 to the Vcc rail 255. Thresholding reference node 401 is further coupled to the commonly connected emitters 553 and 563 of a push-pull configured transistor pair 550–560, the respective bases 552 and 562 of which are connected to the bias terminal Vcc/2. NPN transistor 550 has its collector 551 coupled to the input port 571 of the current mirror 570, while PNP transistor 560 has its collector 561 coupled to AGND.

As will be described, depending upon the relationship between the first input current Iin1 and the reference current Iref, the push-pull transistor pair 550–560 selectively steers to the first current mirror the difference between the first input current Iin1 and the reference current Iref (as prescribed by equation (4)), or allows transistor set 500 to feed the actual value of the second input current Iin2 to the first current mirror transistor 570 (as prescribed by equation (5)).

The operation of a respective A/D cell of FIG. 3 may be readily understood by considering the two cases for the value of (the two identical copies Iin1 and Iin2 of) the input current applied to the cell. In one of these cases (case 1), the value of the input current is equal to or greater than the reference current Iref (associated with quantity Q being greater than or equal to Vref/2, as described above). In the other case (case 2), the value of the input current is less than the reference current Iref.

As pointed out above, in the former case, the state of the cell's output bit (BIT) is set to a first prescribed value (e.g., '1'), and the difference between the first input current Iin1 and the reference current Iref is mirrored at each of the current output ports Iout1 and Iout2 for application to the next downstream cell. In the latter case, the state of the cell's output bit (BIT) is set to a second prescribed value (e.g., '0'), and the actual value of the second input current Iin2 is mirrored at each of the current output ports Iout1 and Iout2 for application to the next downstream cell. Each case will be described individually below.

Case 1: Input current (each of Iin1 and Iin2 ) is equal to or greater than the reference current Iref (associated with quantity Q being greater than or equal to Vref/2).

With the value of the input current Iin1 being at least equal to the reference current Iref mirrored through transistor 480 to the thresholding reference node 401, NPN transistor 550 of the push-pull transistor pair 550–560 is turned on, while PNP transistor 560 is turned off. As a result, the difference (Iin1–Iref) between current Iin1 and the reference current Iref is coupled through the emitter-collector path of transistor 550 to the input port 571 of 1:2 current mirror 570. Since PNP transistor 560 is off, the second input current Iin2 is diverted through the output transistor 540 of the second leg of the differential transistor pair 500 to the Vcc rail 255, so that the second input current Iin2 cannot be coupled through output transistor 520 to the input port 571 of current mirror 570.

In addition, the output transistor 420 of the first leg of the bit-resolving differential pair 400 steers to AGND the copy of the bias current Ibias mirrored via terminal vcompb connected to base 452 of transistor 450. This action turns off the bit current output driver circuit 470, so as to apply a high ('1') logic level at the output terminal BIT.

Case 2: Input current (each of Iin1 and Iin2 ) is less than the reference current Iref (associated with quantity Q being less than Vref/2).

With the value of the input current Iin1 being less than the reference current Iref mirrored through transistor 480 to thresholding reference node 401, NPN transistor 550 of the push-pull transistor pair 550–560 is turned off, while the PNP transistor 560 is turned on. As a result, the emitter-collector path through transistor 550 to the input port 571 of 1:2 current mirror 570 is disabled. On the other hand, with PNP transistor 560 being turned on, the second input current Iin2 is coupled through the output transistor 520 of the first leg of the current-steering differential pair 500 to the input port 571 of current mirror 570.

At the same time, the output transistor 440 of the second leg of the bit-resolving differential pair 400 steers the copy of the bias current Ibias mirrored via terminal vcompb connected the base 452 of transistor 450 to the bit current output driver circuit 470, which turns on, and causes a low ('0') logic level to be applied to the output terminal BIT.

FIG. 4 schematically shows the configuration of the last or (N–1)th A/D cell 20-N-1 of the cascaded architecture of FIG. 1. As described above, this cell is configured to provide both the next to least significant bit (BIT-(N–1)) and the least significant bit (LSB) or BIT-N of the resolved N bit code. To process the N–1th bit, the cell architecture of FIG. 4 includes an (N–1)th bit stage 600, to which the output currents Iout1 and Iout2 from the immediately upstream bit cell are coupled. Except for a reduction in the number of outputs of the second mirror circuit 580 of the A/D cell 20 of FIG. 3 to a single output port 582, the configuration and operation of the (N–1)th bit stage 600 are identical to that of FIG. 3 and a description thereof will not be repeated here.

To process the last or Nth bit, the A/D bit cell architecture of FIG. 4 further includes an Nth bit stage 700, having its thresholding reference node 401 coupled to receive the single output current Iout1-(N–1) from the (N–1)th stage 600. Since this Nth bit stage is coupled to no additional downstream cell, it need generate no output current(s); instead, its function is simply to determine the bit value of the LSB at bit output terminal LSB. As a consequence, the circuitry of the Nth bit stage 700 is configured the same as that of the (N–1)th bit stage 600, except that the current-steering differential pair 500 and the first and second current mirrors 570 and 580 of bit stage 600 are eliminated. The operation of the LSB stage is otherwise the same as that described above for a respective bit cell.

As will be appreciated from the foregoing description, the A/D converter of the present invention utilizes the performance and signal processing functionality of the transconductance amplifier circuit disclosed in the above-referenced '408 application, to realize a cascaded arrangement of current mode-based threshold detector bit cells. In this cascaded multi-cell configuration successive bit decisions ripple from the MSB cell to the LSB cell, yet there is no sampling delay associated with each successive bit-stage of the converter. The only delay encountered is that associated with the electronic propagation delays of the electronic components in the path through downstream threshold-based bit cells. This enables the cascaded A/D converter of the invention to realize very fast conversion times.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. An N-bit analog-to-digital (A/D) converter comprising:
    a front end stage adapted to receive an input to be digitized, and providing first and second currents representative of said input; and
    a plurality of bit cells coupled in cascade with said front end stage, most significant bit cell first, and successively therefrom towards lesser significant bit cells, said most significant bit cell being coupled to receive said first and second currents from said front end stage, and being adapted to output first and second output currents; and
wherein
    a respective ith bit cell is adapted to resolve a single ith digital bit of an overall N-bit digital code output of said A/D converter and establish a value of first and second output currents for application to an (i+1)th bit cell, in accordance with a value of said first and second input currents received from an (i–1)th bit cell and exclusive of a sample and store operation conducted thereby.

2. The N-bit analog-to-digital converter according to claim 1, wherein said front end stage is adapted to provide said first and second currents exclusive of a sample and store operation conducted on said input.

3. The N-bit analog-to-digital converter according to claim 1, wherein said respective ith bit cell is adapted to resolve said single ith digital bit and establish the value of first and second output currents for application to the (i+1)th bit cell, in accordance with a prescribed relationship between a first reference current and the value of said first and second input currents received from said (i–1)th bit cell.

4. The N-bit analog-to-digital converter according to claim 3, wherein said respective ith bit cell includes a current mirror circuit and a current steering circuit to which one of said first and second input currents is applied, said current steering circuit being operative to couple to said current mirror circuit a selected one of the value of said first and second input currents, and the difference between the value of said first and second input currents and said first reference current, in accordance with said prescribed relationship between said first reference current and the value of said first and second input currents.

5. The N-bit analog-to-digital converter according to claim 3, wherein said respective ith bit cell includes a bit-resolving circuit that is adapted to resolve said single ith digital bit in accordance with said prescribed relationship between said first reference current and the value of said first and second input currents received from said (i−1)th bit cell, and an output current control circuit that is adapted to control the value of first and second output currents output by said ith bit cell, in accordance with said prescribed relationship between said first reference current and the value of said first and second input currents.

6. The N-bit analog-to-digital converter according to claim 5, wherein said bit-resolving circuit comprises a first differential circuit configured to resolve said single ith digital bit in accordance with said prescribed relationship between said first reference current and the value of said first and second input currents received from said (i−1)th bit cell, and in accordance with a second reference current supplied thereto.

7. The N-bit analog-to-digital converter according to claim 6, wherein said first and second reference currents are based upon a bandgap reference.

8. The N-bit analog-to-digital converter according to claim 6, wherein said output current control circuit includes a current mirror circuit and a current steering circuit to which one of said first and second input currents is applied, said current steering circuit being operative to couple to said current mirror circuit a selected one of the value of said first and second input currents, and the difference between the value of said first and second input currents and said first reference current, in accordance with said prescribed relationship between said first reference current and the value of said first and second input currents.

9. The N-bit analog-to-digital converter according to claim 8, wherein said current steering circuit includes a second differential circuit to which one of said first and second input current is applied, and being operative to couple to said current mirror circuit said one of said first and second input currents, in accordance with a predetermined relationship between said first reference current and the value of said first and second input currents, but to otherwise allow the difference between the value of said first and second input currents and said first reference current to be coupled to said current mirror circuit.

10. The N-bit analog-to-digital converter according to claim 1, wherein said front end stage includes:
a transconductance gain stage including an operational amplifier configured as a unity gain buffer and an output stage having an input/output port coupled to a first, inverting input of said operational amplifier, a second, non-inverting input of said operational amplifier being coupled to a reference voltage, said input/output port being coupled through an input resistor to an input port to which said input to be digitized is coupled; and
first and second current mirror circuits coupled to said output stage of said transconductance amplifier gain stage and having first and second current output ports thereof coupled in common to provide said first current representative of said input first, and having third and fourth current output ports thereof coupled in common to provide said current representative of said input.

11. A circuit comprising:
first and second input ports to which copies of an input current are supplied;
first and second output ports from which first and second copies of an output current are respectively provided;
a quantization value-resolving circuit coupled to said first input port and adapted to resolve a quantization value of said input current in accordance with a prescribed relationship between a first reference current and a value of said input current; and
an output current generation circuit coupled to said first and second input ports and adapted to define the magnitude of said first and second copies of said output current in accordance with said prescribed relationship between said first reference current and the value of said input current.

12. The circuit according to claim 11, wherein said output current generation circuit includes a current mirror circuit, and a current steering circuit to which one of said copies of said input current is applied, said current steering circuit being operative to couple to said current mirror circuit a selected one of the value of said copies of said input current and the difference between the value of said input current and said first reference current, in accordance with said prescribed relationship between said first reference current and the value of said input current.

13. The circuit according to claim 12, wherein said wherein said quantization value-resolving circuit comprises a first differential circuit that is configured to resolve said quantization value of said input current, in accordance with said prescribed relationship between said first reference current and the value of a second reference current supplied thereto.

14. The circuit according to claim 13, wherein said current steering circuit includes a second differential circuit to which one of said copies of said input current is applied, and being operative to couple to said current mirror circuit said one of said copies of said input current, in accordance with a predetermined relationship between said first reference current and the value of said input current, but to otherwise allow the difference between the value of said input current and said first reference current to be coupled to said current mirror circuit.

15. The circuit according to claim 14, further including a transconductance amplifier-based, voltage-to-current converter circuit which is operative to generate said copies of said input current applied to said first and second input ports in accordance with an input voltage.

16. The circuit according to claim 15, wherein said transconductance amplifier-based, voltage-to-current converter circuit is configured to generate said first and second reference currents in accordance with a bandgap reference.

17. A method of digitizing an analog quantity into an N-bit digital code representative thereof comprising the steps of:
(a) generating first and second analog currents representative of said analog quantity;
(b) coupling said first and second analog currents generated in step (a) to a most significant bit cell of a plurality of bit cells coupled in cascade from said most significant bit cell successively toward lesser significant bit cells, a respective ith bit cell being operative to generate a single ith digital bit of said N-bit digital code, and establish a value of first and second output currents for application to an (i+1)th bit cell, in accordance with a value of first and second input currents received from an (i−1)th bit cell and exclusive of a sample and store operation.

18. The method according to claim 17 wherein said respective ith bit cell is adapted to output said single ith digital bit and establish the value of first and second output currents for application to the (i+1)th bit cell, in accordance with a prescribed relationship between a first reference current and the value of said first and second input currents received from the (i−1)th bit cell.

19. The method according to claim 18, wherein said respective ith bit cell includes a current mirror circuit and a current steering circuit to which one of said first and second input currents is applied, said current steering circuit being operative to couple to said current mirror circuit a selected one of the value of said first and second input currents, and the difference between the value of said first and second input currents and said first reference current, in accordance with said prescribed relationship between said first reference current and the value of said first and second input currents.

20. The method according to claim 19, wherein said ith bit cell further includes a first differential circuit configured to resolve said single ith digital bit in accordance with said prescribed relationship between said first reference current and the value of said first and second input currents received from said (i−1)th bit cell, and in accordance with a second reference current supplied thereto.

* * * * *